United States Patent
Bourke et al.

(10) Patent No.: US 8,823,465 B2
(45) Date of Patent: Sep. 2, 2014

(54) CLOCK GENERATOR FOR CRYSTAL OR CERAMIC OSCILLATOR AND FILTER SYSTEM FOR SAME

(75) Inventors: Donal Bourke, Mallow (IE); Dermot O'Keeffe, Blarney (IE)

(73) Assignee: Analog Devices, Inc., Norwood, MA (US)

( * ) Notice: Subject to any disclaimer, the term of this patent is extended or adjusted under 35 U.S.C. 154(b) by 162 days.

(21) Appl. No.: 13/469,914

(22) Filed: May 11, 2012

(65) Prior Publication Data

US 2013/0300512 A1    Nov. 14, 2013

(51) Int. Cl.
    H03B 5/30      (2006.01)
    H03K 3/011     (2006.01)
    H03K 3/012     (2006.01)
    H03K 3/013     (2006.01)

(52) U.S. Cl.
    CPC .............. *H03K 3/011* (2013.01); *H03K 3/012* (2013.01); *H03K 3/013* (2013.01)
    USPC ..................... 331/154; 331/116 FE; 327/551; 327/552; 327/555; 327/558; 327/559

(58) Field of Classification Search
    CPC ........ H03K 3/011; H03K 3/012; H03K 3/013
    USPC ........... 331/116 R, 116 FE, 116 M, 154, 158, 331/160, 186; 327/551, 552, 555, 558, 559
    See application file for complete search history.

(56) References Cited

U.S. PATENT DOCUMENTS

| | | | |
|---|---|---|---|
| 4,710,730 A | | 12/1987 | Doyle, III |
| 5,455,542 A | * | 10/1995 | Spence et al. ................. 331/158 |
| 6,278,338 B1 | * | 8/2001 | Jansson ................... 331/116 FE |
| 6,836,169 B2 | | 12/2004 | Richmond et al. |
| 7,154,352 B2 | | 12/2006 | Smith et al. |
| 7,362,190 B2 | * | 4/2008 | Berens et al. ................... 331/74 |
| 7,536,164 B2 | | 5/2009 | Maligeorgos et al. |
| 7,689,190 B2 | | 3/2010 | Kerth et al. |
| 2004/0160285 A1 | * | 8/2004 | Lovelace et al. .............. 331/183 |
| 2010/0301913 A1 | | 12/2010 | Li et al. |

OTHER PUBLICATIONS

PCT International Search Report and Written Opinion for PCT/US2013/038831, mailed on Sep. 5, 2013, 13 pages.
Analog Devices, Inc., "High Performance, ISM Band, FSK/ASK Transceiver IC", ADF7020 Data Sheet, Rev. C, May 2011.

(Continued)

*Primary Examiner* — Arnold Kinkead
*Assistant Examiner* — Richard Tan
(74) *Attorney, Agent, or Firm* — Kenyon & Kenyon, LLP

(57) ABSTRACT

A clock generator is disclosed for use with an oscillator device. The clock generator may include a signal conditioning pre-filter and a comparator. The signal conditioner may have an input for a signal from the oscillator device, and may include a high pass filter component and a low pass filter component. The high pass filter component may pass amplitude and frequency components of the input oscillator signal but reject a common mode component of the oscillator signal. Instead, the high pass filter component further may generate its own common mode component locally over which the high frequency components are superimposed. The low pass filter component may generate a second output signal that represents the locally-generated common mode component of the first output signal. The clock generator may have a comparator as an input stage which is coupled to first and second outputs of the filter structure.

20 Claims, 4 Drawing Sheets

(56) References Cited

OTHER PUBLICATIONS

Analog Devices, Inc., "High Performance, Low Power, ISM Band FSK/GFSK/OOK/MSK/GMSK Transceiver IC", ADF7023 Data Sheet, Rev. B, Mar. 2011.
Abdul Aleaf, "A Study of the Crystal Oscillator for CMOS-COPS," National Semiconductor Application Note 400, Aug. 1986, 4 pages.
Abracon Corporation, Quartz Crystal Glossary Terms, Application Notes, 2 pages.
Bible, S., "Crystal Oscillator Basics and Crystal Selection for rfPIC™ and PICmicro® Devices", Microchip, Application Note AN826, 2002, pp. 1-14.
Cerda, R., "Pierce-Gate Crystal Oscillator, an introduction", MP Digest, Mar. 2008, pp. 1-3.
Chrontel, "Crystal Oscillator", Application Note AN-06, Jul. 26, 2001, pp. 1-4.
Cox, C. et al., "Microcontroller Oscillator Circuit Design Considerations", Freescale Semicondtor, Application Note AN1706/D, 2004, pp. 1-12.
Fairchild Semiconductor, "HCMOS Crystal Oscillators,", Application Note 340, May 1983, pp. 1-4.
Scalpi, A., "Crystal Oscillator Design and Negative Resistance", AnalogZone, pp. 1-11.
Spevak, P. et al., "MSP430 32-kHz Crystal Oscillators", Texas Instruments, Application Report SLAA322B, Aug. 2006, Revised Apr. 2009, pp. 1-11.
Wikipedia, "Pierce Oscillator", Dec. 2011, 1 page.

* cited by examiner

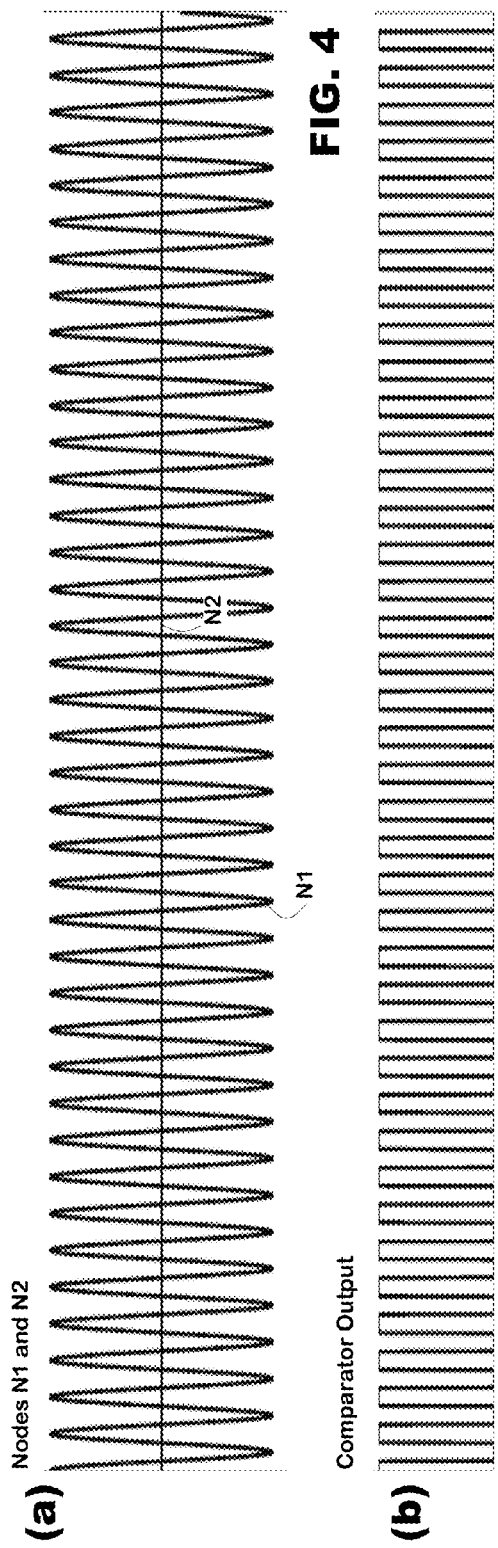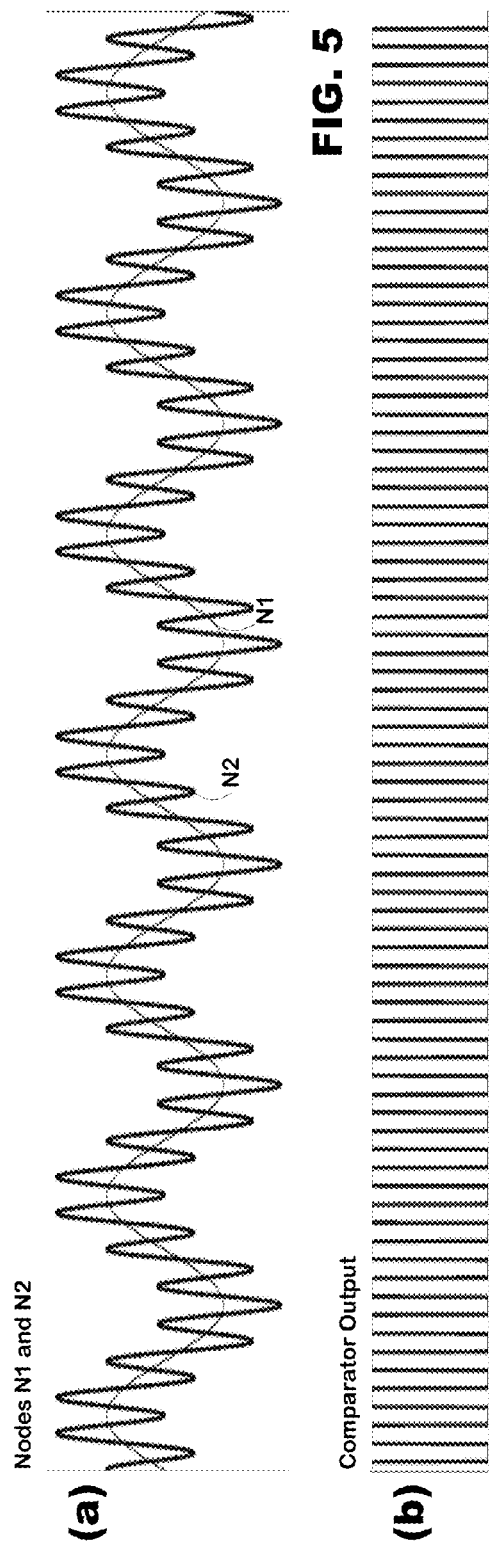

CLOCK GENERATOR FOR CRYSTAL OR CERAMIC OSCILLATOR AND FILTER SYSTEM FOR SAME

BACKGROUND

Embodiments of the present invention relate to clock generators for integrated circuits and, in particular, to clock generators that conserve power and provide stable operation.

Modern processing systems employ integrated circuits that rely on clock signals for timing and synchronization. Often, such clock signals are derived from oscillator devices, such as crystal-based oscillators or ceramic resonator-based oscillators. When an integrated circuit supplies an excitation signal to the crystal or ceramic resonator, the device responds by generating response signals that oscillate at a pre-defined frequency.

FIG. 1 illustrates two different oscillator structures. In FIG. 1(a), the oscillator is shown as including a crystal XTAL, an inverter INV and a bias resistor $R_{BIAS}$, each connected to the other in parallel. The crystal XTAL is a material that generates oscillation signals in response to an activation signal, which is applied by the inverter INV. The resistor $R_{BIAS}$ is a resistor that sets a common mode bias for an operating point of the inverter and increases its gain. FIG. 1(a) illustrates a pair of capacitors $C_{OSC}1$, $C_{OSC}2$, each of which is connected between ground and a respective terminal of the crystal XTAL. The capacitors $C_{OSC}1$, $C_{OSC}2$ may provide stability in the face of process, voltage and/or temperature variations of the oscillator. Typically, the crystal XTAL, the resistors $R_{BIAS}$ and capacitors $C_{OSC}1$, $C_{OSC}2$ are discrete components that reside outside of the integrated circuit that generates a clock signal. The inverter may reside within the integrated circuit.

The inverter is an active circuit component that draws power during operation. Inverter outputs typically involve unregulated currents that, in many cases, exceed an amount of current necessary to drive the crystal XTAL. The oscillator circuit of FIG. 1(a), therefore, is not an energy-efficient structure.

In FIG. 1(b), the oscillator is shown as including a crystal XTAL, bias resistor $R_{BIAS}$ and capacitors $C_{OSC}1$, $C_{OSC}2$ just as in the FIG. 1(a) structure. Rather than include the inverter INV of the FIG. 1(a) structure, the FIG. 1(b) structure includes a conductance stage, formed of a transistor TR1 and bias current source $I_{BIAS}$. The current source $I_{BIAS}$ provides a bias on the transistor, which sets gain around the crystal XTAL. In some cases, the current source may provide a constant current to the biased transistor but, in other cases, the current source may vary dynamically during operation. In this latter case, the oscillator may be controlled by an amplitude control system which varies the current output by the current source based on an amplitude of signals (XTAL1) detected at the crystal XTAL.

Dynamic variation of the current can achieve good current conservation during operation of an oscillator. When an oscillator first is engaged, TR1 is biased by a relatively large current to provide a good response by the crystal XTAL. As the oscillator reaches steady state operation, crystal oscillation may be maintained by a driving current of lower magnitude.

FIG. 1(b) also illustrates a clock generator circuit that may be used with an oscillator. The clock generator includes a resistor-capacitor filter structure and one or more inverters coupled in cascade. During operation, the crystal generates a signal XTAL1 on the XTAL pin that exhibits a generally sinusoidal character. The XTAL1 signal is AC-coupled to the inverters. In ideal operating circumstances, a voltage at the input of the inverter should oscillate about a triggering point of the inverter. The inverter would respond to the generally sinusoidal input signal presented at its input by generating a binary output signal having a frequency that matches the frequency of the sinusoidal signal.

The inventor has determined that dynamic variation of the current source that drives the oscillator can lead to variation of common mode operating points of the signal input to the inverter within the clock generator. Variation of the common mode operation point can lead to generation of an output clock signal that does not have a 50% duty cycle. In extreme cases, it can lead to loss of the output clock signal altogether. Accordingly, the inventor identified a need for a clock generator that reliably generates an output clock signal in the presence of common mode variation on its input signals. Moreover, the inventor identified a need in the art for a clock generator that operates reliably with a current-controlled oscillator.

BRIEF DESCRIPTION OF THE DRAWINGS

FIGS. 3-5 are graphs illustrating signal waveforms that may be generated by the circuit configuration of FIG. 2.

DETAILED DESCRIPTION

Embodiments of the present invention may provide a clock generator for use with an oscillator device that includes a filter structure and a comparator. The filter structure may have an input for a signal from the oscillator device, and may include a high pass filter component and a low pass filter component. The high pass filter component may pass desired amplitude and frequency components of the input oscillator signal but reject any undesired common mode component of the oscillator signal. Instead, the filter structure may generate its own common mode component locally over which the desired high frequency components are superimposed. The low pass filter component may generate a second output signal that represents the locally-generated common mode component of the first output signal. The clock generator may have a comparator as an input stage which is coupled to first and second outputs of the filter structure.

For purposes of the present discussion, "high frequency" components of oscillator signals may be considered to be portions of the oscillator signals that occur at the frequencies the oscillator device is designed to supply to an integrated circuit. For example, common crystal oscillator circuits often are designed around relatively few standard frequencies, such as 3.5795 MHz, 3.6864 MHz, 4.4336 MHz, 10 MHz, 14.3181 MHz, 17.7344 MHz, 20 MHz, 26 MHz, 33.33 MHz, and 40 MHz. By contrast, "common mode" components of oscillator signals are portions of the oscillator signals that operate at frequencies much lower than the high frequency components, for example, the DC (0 MHz) component and frequencies near to DC.

Figure 1:
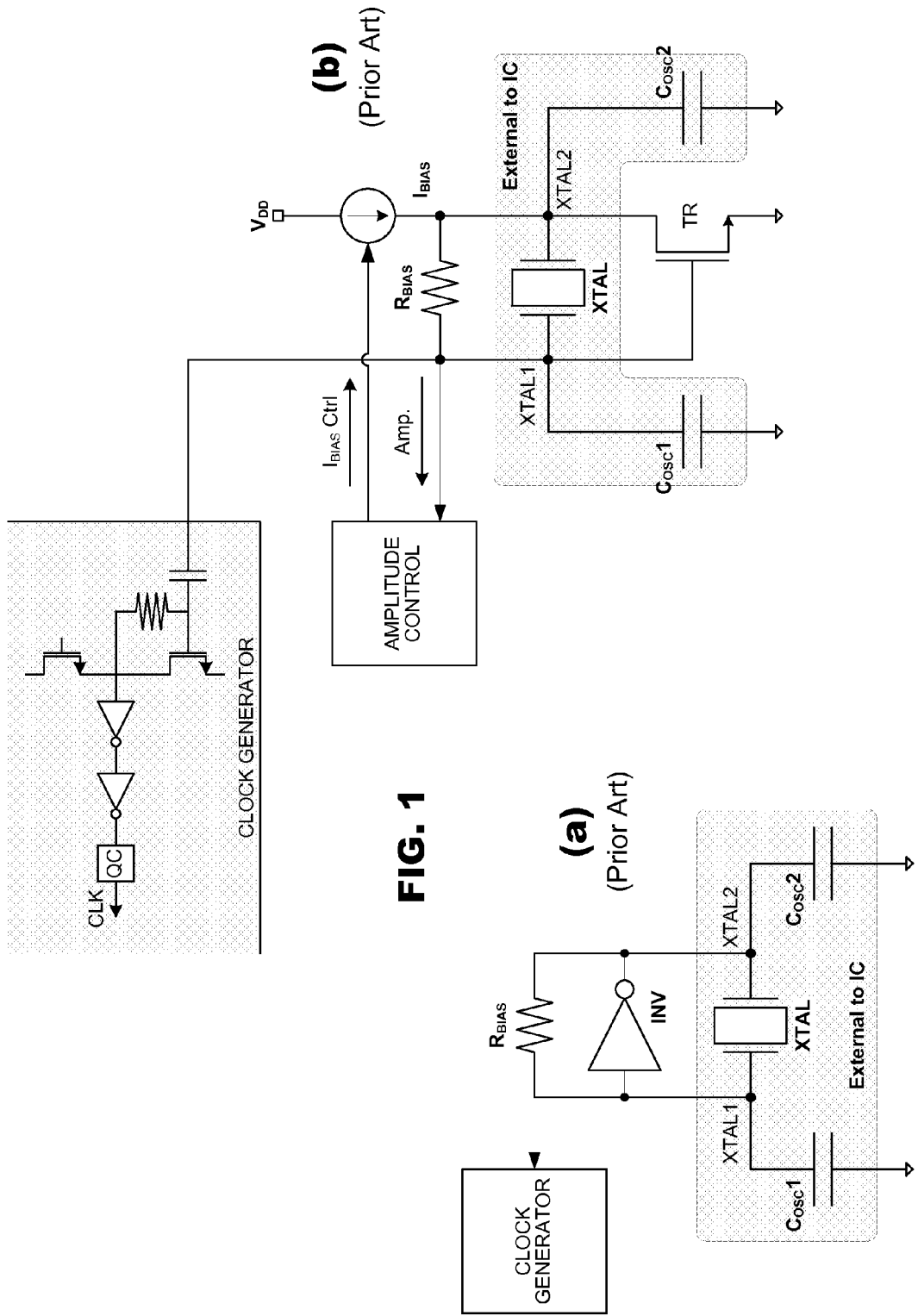
FIG. 1 includes two circuit diagrams illustrating common oscillator device configurations.
Figure 2:
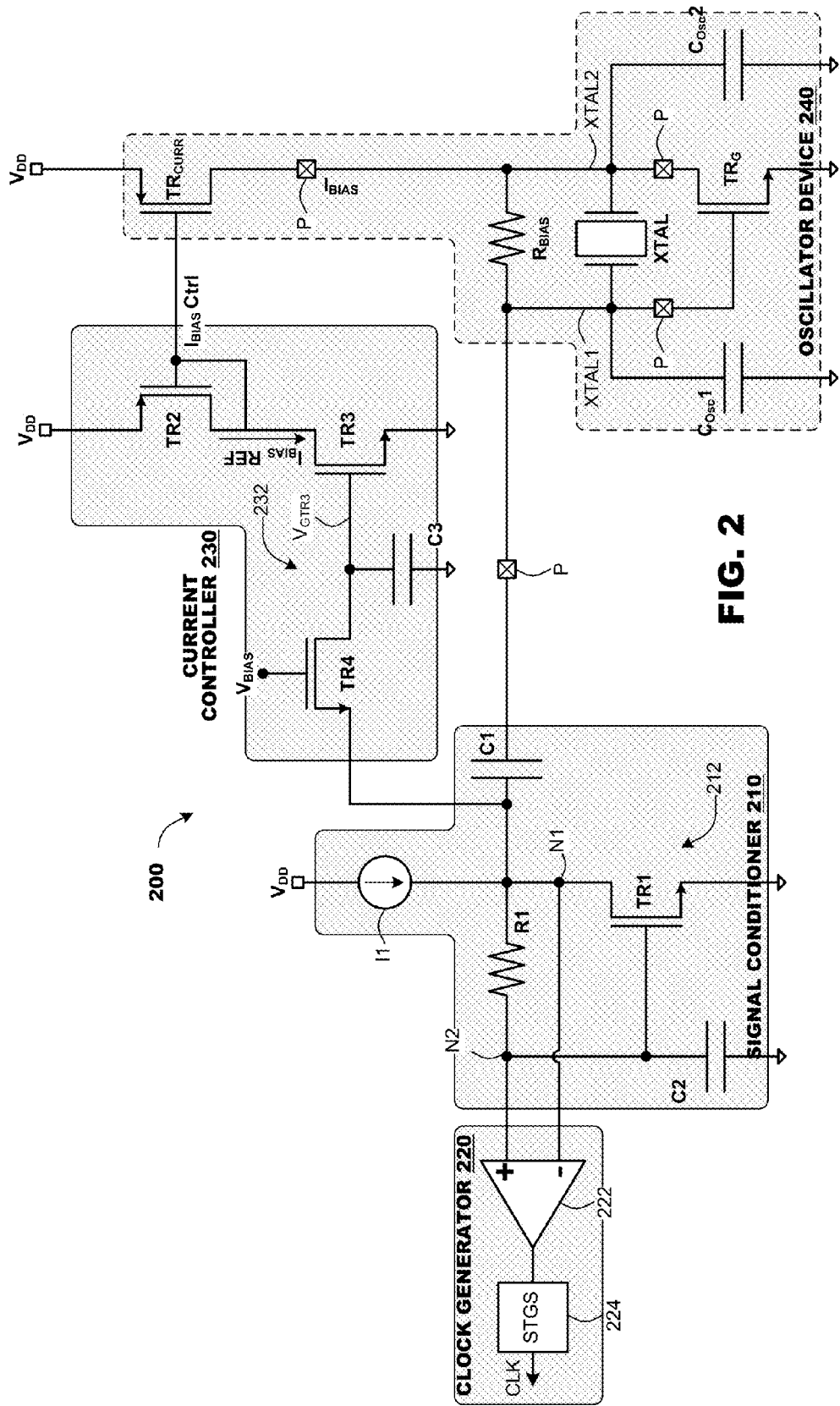
FIG. 2 is a circuit diagram of an integrated circuit according to an embodiment of the present invention.

FIG. 2 illustrates an integrated circuit 200 according to an embodiment of the present invention. The integrated circuit 200 may include a signal conditioning circuit 210, a clock generator 220 and, optionally, a current controller 230. The signal conditioner 210 may have an input for a signal (XTAL1) from an oscillator device 240, which as discussed may have a common mode component that varies as the bias current $I_{BIAS}$ in the oscillator device 240 varies. The signal conditioner 210 may generate two outputs to the clock generator 220: A first output signal (node "N1") that includes high frequency components of the input signal XTAL1 received from the oscillator device 240 and a locally-generated common mode component, and a second output signal (node "N2") that includes the locally-generated common mode component of the N1 signal. The clock generator 220 may include an input stage that compares the two output signals from the signal conditioner 210. The current controller 230 may generate a current control signal $I_{BIAS}$ Ctrl from the first output of the signal conditioner 210.

During operation, the clock generator 220 may generate a clock signal from a comparison of the two signals output by the signal conditioner 210. Since both output signals should carry similar common mode components, the clock generator 220 may operate accurately even when common mode components vary at low frequencies due to, for example, temperature and/or manufacturing variations. The high frequency components of the signal at node N1 should vary about the local common mode component at frequencies determined by the oscillator device 240. Thus, the circuit configuration of FIG. 2 may take advantage of accuracies associated with crystal and ceramic resonator-based oscillator devices and avoid problems associated with common mode drift in such devices.

The current controller 230 may accept an input from node N1 and may generate the current control signal $I_{BIAS}$ Ctrl to vary in inverse proportion to variations in the input signal. That is, when the input signal at node N1 has a relatively small amplitude, the current control signal $I_{BIAS}$ Ctrl may induce bias currents in the oscillator device 240 that have a relatively large amplitude; typically, a small amplitude input signal at node N1 occurs on power up of the integrated circuit and the crystal begins oscillation. When the input signal at node N1 has a relatively large amplitude, the current control signal $I_{BIAS}$ Ctrl may induce bias currents in the oscillator device 240 that have a relatively small magnitude; typically, large amplitude input signals at node N1 occur when the crystal approaches steady state operating conditions. By reducing the bias currents in the oscillator device 240 in a manner that vary inversely in proportion to the input signal at node N1, which itself represents amplitude of the signals across the crystal, the design conserves power.

In an embodiment, the signal conditioner 210 may include a filter structure 212 formed by a series combination of a first capacitor C1, transistor TR1, a resistor R1 and a second capacitor C2 that are coupled to the XTAL1 signal and ground and a transistor TR1 extending between node N1 and ground on a source to drain path. The signal conditioner 210 further may include a current source I1 that provides current to node N1 to bias transistor TR1. The N1 and N2 output signals may be taken from respective terminals of the resistor R1. The filter structure 212 may provide several functions to the integrated circuit 200. First, the capacitor C1 and the transistor TR1 may form a high pass filter structure having a corner frequency that is sufficient to pass the frequency of oscillation of the crystal (the frequency of XTAL1) but reject any common mode components of XTAL1. When looking into node N1 from C1 of the signal conditioner, C1 is presented with an input impedance of 1/GmTR1, where GmTR1 represents the transconductance of TR1. The high pass corner frequency of the filter structure may be determined by GmTR1/(C1). The voltage at node N1 may have a locally-established common mode value but it will exhibit voltage swings at an amplitude and frequency as established by the XTAL1 signal.

Second, the capacitor C2 and resistor R1 may form a low pass filter that passes the common mode component of the voltage at node N1 but rejects the high frequency components. Essentially, the low pass filter structure generates a voltage at node N2 that represents the common mode at node N1. The voltage at node N2 may control conductance of the TR1 transistor which provides a feedback path in the signal conditioner 210 to ensure that any variation in the voltage at node N2 also induces a corresponding variation in the common mode components at node N1, to the extent that the natural RC properties of the signal conditioner 210 would be insufficient to induce such a variation itself.

In an embodiment, filter 212 may use a biased transistor (not shown) as a substitute for resistor R1. In this case, the transistor may be biased by a control voltage (also not shown) that sets the transistor to a predetermined conductance. The transistor, therefore, would provide an impedance to the filter structure much as a resistor provides and sets RC characteristics of the filter structure 212.

FIG. 2 illustrates a clock generator 220 in simplified block diagram form. The clock generator 220 may include a variety of processing stages to generate and validate the clock signal. For purposes of the present discussion, it is sufficient to note that an input stage 222 to the clock generator 220 may be provided as a comparator that takes its inputs from nodes N1 and N2 of the signal conditioner 210. As discussed, the signal at node N1 may represent a sinusoid having the amplitude and frequency of the XTAL1 input signal that varies about a locally-established common mode voltage. The signal at node N2 may represent the common mode voltage of the signal at node N1. At the comparator 222, the common mode components of the signals at nodes N1 and N2 should null out and the comparator 222 should generate a square wave output signal having a frequency and duty cycle that matches the XTAL1 signal.

In certain embodiments, the clock generator 220 may include other processing stages, represented as 224 in FIG. 2, to qualify the clock output and confirm reliability. These latter processing stages vary in complexity and architecture, the details of which are immaterial to the present discussion. The principles of the present invention find application with them all.

In an embodiment, the current controller 230 may include its own filter structure 232 and a pair of stacked transistors TR2, TR3 provided in a conductive path between $V_{DD}$ and ground. The filter structure 232 is illustrated as including a biased transistor TR4 and a capacitor C3 extending from node N1 to ground but other embodiments are possible. The transistor TR4 may operate as a as a non-linear signal-dependent resistor and supply an impedance to the filter 232.

The stacked transistors TR2, TR3 may provide the $I_{BIAS}$ Ctrl signal to the oscillator device 240. In the configuration shown in FIG. 2, transistor TR3 has its gate coupled to an intermediate node $V_{GTR3}$ within the filter structure 232. Transistor TR2 has its gate coupled to an intermediate between TR2 and TR3. Transistor TR2 is shown connected to a current-providing transistor $TR_{CURR}$ within the oscillator device 240 in a current mirror configuration. In this embodiment, when the current controller 230 creates a current through transistors TR2 and TR3, shown as $I_{BIAS}$ Ref, the current is mirrored over to the oscillator device 240 as the $I_{BIAS}$ current.

During operation, the oscillator device 240 may induce a voltage at node N1 whose amplitude mimics the amplitude of the XTAL1 signal. The filter structure 232 may generate a voltage at the input gate $V_{GTR3}$ of transistor TR3 that varies in proportion but opposite polarity to the amplitude of the voltage at node N1. The voltage $V_{GTR3}$ controls conductance of the transistor TR3, which modulates the $I_{BIAS}$ Ref current. The $I_{BIAS}$ Ref current, in turn, may modulate the $I_{BIAS}$ current in the oscillator device 240. Thus, the current controller 230 may control the $I_{BIAS}$ current in the oscillator device 240 to vary inversely in proportion to amplitude at the XTAL1 signal.

Although FIG. 2 illustrates a one-to-one correspondence between the $I_{BIAS}$ Ref current and the $I_{BIAS}$ current, the principles of the present invention find application in other ratios. For example, circuit designers may find it convenient to provide a one-to-many current mirror configuration in which the transistor TR2 is connected to multiple current-providing transistors (e.g., multiple $TR_{CURR}$ transistors) in the oscillator device 240 and in which currents of the oscillator device 240 transistors are merged together. In this configuration, an incremental change in the $I_{BIAS}$ Ref current may induce an N-fold change in the $I_{BIAS}$ current, where N represents the number of current providing transistors within the oscillator device 240.

Similarly, circuit designers may find it convenient to provide a many-to-one current mirror configuration in which multiple TR2 transistors are provided and coupled to only a single current providing transistor in the oscillator device 240. In this configuration, when the total current passing through all TR2 transistors changes, it may induce a corresponding change in the current providing transistor $TR_{CURR}$ of the oscillator device 240 at 1/Nth the magnitude.

Other circuit configurations are possible. For some uses cases, circuit designers may find it convenient to input the XTAL1 signal directly into the current controller 230 rather than to take the input from node N1. In such configurations, common mode variations in the XTAL1 signal likely would affect operation of the current controller 230 to some degree. Nevertheless, the configurations are within the spirit and scope of the present invention.

Figure 3:
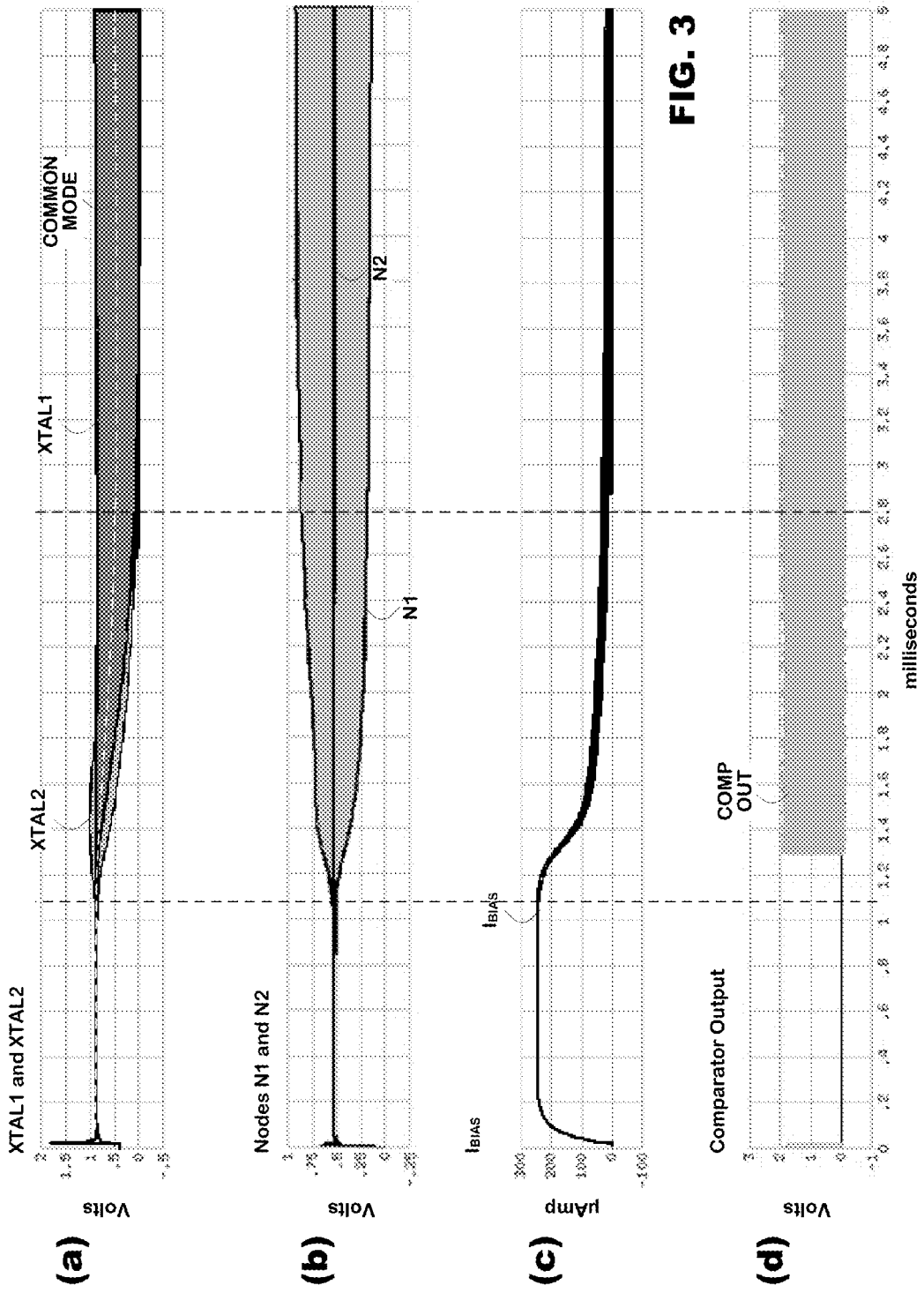

FIG. 3 illustrates timing diagrams, obtained from simulation, that describe operation of the integrated circuit 200 of FIG. 2. FIG. 3(*a*) is a graph that superimposes the XTAL1 and XTAL2 signals over each other. FIG. 3(*b*) is a graph that superimposes the N1 and N2 signals. FIG. 3(*c*) illustrates control of the $I_{BIAS}$ current within the oscillator device and FIG. 3(*d*) illustrates outputs of the comparator 222 within the clock generator. Individual oscillations of the XTAL1, XTAL2, N1 and N2 signals are not perceptible at the timescale illustrated in FIG. 3; however, FIG. 3 is useful to compare common mode variations among them and to describe behavior of the integrated circuit 200.

In FIG. 3, the oscillator device may be engaged at time=10 μsec. At this time, the $I_{BIAS}$ current source is engaged at its highest level, providing current to the crystal XTAL1. The crystal begins to oscillate almost immediately but at amplitudes that are not perceptible in FIG. 3. Crystal oscillations begin to increase markedly at time=1.2 msec which induces changes in the $I_{BIAS}$ current. As illustrated in FIGS. 3(*b*) and 3(*c*), the $I_{BIAS}$ signal drops from a maximum level of ~250 μA to a level of about 30 μA from time=1.2 msec to time=3.6 msec. This drop in $I_{BIAS}$ induces a corresponding drop in the common mode voltage of XTAL1 and XTAL2 from approximately 0.9 volts to 0.5 volts.

By contrast, the signals at nodes N1 and N2 exhibit negligible variation in common mode voltage. The voltage at node N2 remains essentially constant throughout the entire time period shown in FIG. 3. The voltage at node N1 varies in amplitude as the voltage at XTAL1 varies but it is centered about a common mode voltage that is essentially the same as at node N2. The N1 and N2 signals drive the input stage comparator of the clock generator and lead to a COMP OUT output as shown in FIG. 3(*d*).

In the example of FIG. 3(*d*) illustrates output signals for a comparator that has been designed with hysteresis of ~200 mV, so any signal swing s less that that will not be detected as a transition by the comparator. Such embodiments present noise from tripping the comparator and further ensure that a satisfactory amplitude of oscillation has been establishes at the crystal before using its output as a clock source of the integrated circuits. In embodiments where such hysteresis is not designed into the comparator, a comparator may generate output signals at times earlier than indicated in FIG. 3(*d*).

FIGS. 4 and 5 are simulated waveforms that illustrate relationships between the N1 and N2 signals and the COMP OUT signal at a time scale in which individual oscillations are perceptible. FIG. 4 illustrates an idealized case in which there is no variation whatsoever in the common mode components of each signal. FIG. 5 illustrates a case in which the N1 and N2 signals have variations in common mode; both the frequency and amplitude of the common mode variation are exaggerated to better explain the principles of the invention.

As discussed above, the N1 signal exhibits sinusoidal variations centered about a locally-generated common mode voltage. The N2 signal represents the common mode voltage of the N1 signal. In the idealized case illustrated in FIG. 4(*a*) when there is no variation in common mode voltage, the input stage comparator will generate a "1" when the N1 signal exceeds the N2 signal and a "0" otherwise. FIG. 4(*b*) illustrates the output, which is a 50% duty cycle clock signal.

In the exaggerated case of FIG. 5, the N1 signal is shown as a sinusoid centered about a locally-generated common mode voltage that also exhibits sinusoidal variation. The N2 signal represents the common mode voltage of the N1 signal. Again, the input stage comparator generates a "1" when the N1 signal exceeds the N2 signal and a "0" otherwise. As illustrated in FIG. 5(*b*), the input stage comparator may generate a 50% duty cycle clock signal even when presented with varying common mode voltages.

The system illustrated in FIG. 2 finds application with a variety of oscillator devices 240. In the configuration illustrated in FIG. 2, the oscillator device 240 may include a crystal XTAL, a bias resistor $R_{BIAS}$ and capacitors $C_{OSC}1$, $C_{OSC}2$. The oscillator device 240 also may include a conductance stage, formed of a gain transistor $TR_G$ and a current source formed by the $TR_{CURR}$ transistor. The current source transistor $TR_{CURR}$ may provides a bias current to the transistor $TR_G$, which sets gain around the crystal XTAL. As discussed, the current source transistor $TR_{CURR}$ may be coupled to transistor TR2 of the current controller 230 in a current mirror configuration.

The crystal XTAL, bias resistor $R_{BIAS}$ and capacitors $C_{OSC}1$, $C_{OSC}2$ may be provided as discrete devices that are separate from the integrated circuit 200 on which the signal conditioner 210, the clock generator 220 and current controller 230 are provided. The $TR_G$ and $TR_{CURR}$ transistors may be provided within the integrated circuit 200 as well. FIG. 2 illustrates a variety of pins P illustrating points of connection between the integrated circuit 200 and the discrete devices XTAL, $R_{BIAS}$, $C_{OSC}1$ and $C_{OSC}2$ of the oscillator device 240.

Although FIG. 2 illustrates the integrated circuit 200 operating with a crystal-based oscillator, the principles of the present invention are not so limited. The integrated circuit 200 also finds application with ceramic resonator-based oscillator devices.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. Apparatus for use with an oscillator device, comprising:
a signal conditioner having an input for a signal from the oscillator device, the signal conditioner comprising:
a high pass filter component structured to pass amplitude and frequency components of the oscillator signal but reject a common mode component of the oscillator signal, the high pass filter component further structured to generate a first output signal that includes the amplitude and frequency components of the oscillator signal about a locally-generated common mode component signal;
a low pass filter component structured to generate a second output signal that represents the locally-generated common mode component signal; and
a clock generator having an input stage comparator, the comparator having input terminals coupled to first and second outputs of the signal conditioner.

2. The apparatus of claim 1, wherein the signal conditioner and clock generator are provided in a common integrated circuit, separate from the oscillator device.

3. The apparatus of claim 1, wherein the high pass filter has a corner frequency below an operating frequency of the oscillator.

4. The apparatus of claim 1, further comprising an amplitude controller, comprising:
a controller filter having an input coupled to the first output of the signal conditioner, the controller filter structured to generate an output signal that varies in inverse proportion to amplitude of a signal at its input,
a control signal generator, having an input coupled to the controller filter output to generate a current control signal for output to the oscillator device.

5. The apparatus of claim 4, wherein the controller filter is a resistor/capacitor filter.

6. The apparatus of claim 4, wherein the controller filter comprises a transistor having a predetermined conductance and a capacitor.

7. The apparatus of claim 1, wherein the high pass filter component and low pass filter component are formed by a series combination of a first capacitor, a resistor and a second capacitor.

8. The apparatus of claim 1, further comprising an amplitude controller, comprising:
a controller filter having an input for the signal from the oscillator device, the controller filter structured to generate an output signal that varies in inverse proportion to amplitude of a signal at its input, and
a control signal generator, having an input coupled to the controller filter output to generate a current control signal for output to the oscillator.

9. A method for generating a clock from an oscillator device, comprising:
high pass filtering an input signal from the oscillator device to generate a first output signal having a frequency and amplitude reflecting a frequency and amplitude of the oscillator signal but having an independently-generated common mode component,
low pass filtering the first output signal to generate a second output signal having a common mode that represents the common mode component of the first output signal, and
generating a clock signal from a comparison of the first and second output signals.

10. The method of claim 9, further comprising a method for controlling current consumption in the oscillator device, comprising:
filtering the first output signal to generate an intermediate control signal that varies inversely in proportion to amplitude variations in the input signal,
generating a current control signal from the intermediate control signal, and
outputting the current control signal to the oscillator device.

11. The method of claim 9, wherein the oscillator device has a characteristic operating frequency and the high pass filtering has a corner frequency below the oscillator device's operating frequency.

12. A clock generator for use with an oscillator device, comprising:
a signal conditioner having an input for a signal from the oscillator device, the signal conditioner comprising:
a first capacitor, a resistor and a second capacitor provided in a circuit path from the input to a voltage reference,
a transistor having a drain terminal coupled to a first terminal of the resistor, a gate terminal coupled to a second terminal of the resistor, and a source coupled to the voltage reference, and
a current source coupled to the drain of the transistor; and
a comparator having a pair of inputs each coupled to a respective terminal of the resistor.

13. The clock generator of claim 12, wherein the signal conditioner and comparator are provided in a common integrated circuit, separate from the oscillator device.

14. The clock generator of claim 12, wherein the first capacitor, the resistor and the transistor form a high pass filter having a corner frequency below an operating frequency of the oscillator.

15. The clock generator of claim 12, wherein the second capacitor and the resistor form a low pass to generate a signal at the second terminal of the resistor having a common mode that represents a common mode component of a signal present at the first terminal of the resistor.

16. The clock generator of claim 12, further comprising an amplitude controller, comprising:
a controller filter having an input coupled to the first terminal of the resistor, the controller filter structured to generate an output signal that varies in inverse proportion to amplitude of a signal at its input,
a control signal generator, having an input coupled to the controller filter output to generate a current control signal for output to the oscillator.

17. The clock generator of claim 16, wherein the controller filter is a resistor/capacitor filter.

18. The clock generator of claim 16, wherein the controller filter comprises a transistor having a predetermined conductance and a capacitor.

19. The clock generator of claim 12, further comprising an amplitude controller, comprising:
a controller filter having an input for the signal from the oscillator device, the controller filter structured to generate an output signal that varies in inverse proportion to amplitude of a signal at its input,
a control signal generator, having an input coupled to the controller filter output to generate a current control signal for output to the oscillator.

20. Apparatus for use with an oscillator device, comprising:

a filter structure having an input for a signal from the oscillator device, the filter structure comprising:
   a high pass filter component structured to pass amplitude and frequency components of the oscillator signal but reject a common mode component of the oscillator signal, the high pass filter component further structured to generate a first output signal that includes the amplitude and frequency components of the oscillator signal about a locally-generated common mode component signal;
   a low pass filter component structured to generate a second output signal that represents the locally-generated common mode component signal;
an amplitude controller, comprising:
   a controller filter having an input coupled to the first output of the filter structure, the controller filter structured to generate an output signal that varies in inverse proportion to amplitude of a signal at its input,
   a control signal generator, having an input coupled to the controller filter output to generate a current control signal for output to the oscillator; and
a clock generator having an input stage comparator, the comparator having input terminals coupled to first and second outputs of the filter structure.

* * * * *